United States Patent
Mulay et al.

(10) Patent No.: US 12,439,549 B2
(45) Date of Patent: Oct. 7, 2025

(54) CORONA DISCHARGE POWERED COOLING

(71) Applicant: EATON INTELLIGENT POWER LIMITED, Dublin (IE)

(72) Inventors: Amol Suresh Mulay, Pune (IN); Christopher Cantrell, Jackson, MI (US); Peter Fritz, Dublin (IE); Armen Baronian, Toronto (CA)

(73) Assignee: EATON INTELLIGENT POWER LIMITED, Dublin (IE)

(*) Notice: Subject to any disclaimer, the term of this patent is extended or adjusted under 35 U.S.C. 154(b) by 580 days.

(21) Appl. No.: 17/871,640

(22) Filed: Jul. 22, 2022

(65) Prior Publication Data
US 2023/0024941 A1    Jan. 26, 2023

(30) Foreign Application Priority Data
Jul. 23, 2021  (IN) .............................. 202111033117

(51) Int. Cl.
*H05K 7/20* (2006.01)
*H01T 19/00* (2006.01)

(52) U.S. Cl.
CPC ......... *H05K 7/20172* (2013.01); *H01T 19/00* (2013.01); *H05K 7/20145* (2013.01); *H05K 7/2039* (2013.01)

(58) Field of Classification Search
CPC ........... H05K 7/20172; H05K 7/20145; H05K 7/2039; H01T 19/00
See application file for complete search history.

(56) References Cited

U.S. PATENT DOCUMENTS

| | | | |
|---|---|---|---|
| 3,638,058 A | 1/1972 | Fritzius | |
| 5,387,477 A * | 2/1995 | Cheiky | H01M 50/209 429/415 |
| 6,504,308 B1 | 1/2003 | Krichtafovitch et al. | |
| 6,522,536 B2 * | 2/2003 | Brewer | H05K 7/20727 165/80.3 |
| 6,785,113 B1 * | 8/2004 | Pham | H01T 19/00 361/231 |
| 7,149,085 B2 * | 12/2006 | Chebiam | H01L 23/473 257/E23.098 |

(Continued)

FOREIGN PATENT DOCUMENTS

| | | |
|---|---|---|
| CN | 111263504 A | 6/2020 |
| JP | 2005-106456 A | 4/2005 |
| WO | 2020/223300 A1 | 11/2020 |

OTHER PUBLICATIONS

Extended European Search Report for Application No. 22186579.3 mailed Jan. 9, 2023.

(Continued)

*Primary Examiner* — Raheena R Malik
(74) *Attorney, Agent, or Firm* — Merchant & Gould P.C.

(57) ABSTRACT

A thermal management system includes an ionic motion generator to direct fluid flow towards a heated component (e.g., equipment to be cooled or a heatsink mounted thereat). In certain systems, the fluid is directed through a conduit arrangement. In certain systems, the fluid is directed past the heated component to a heat exchanger. Certain types of thermal management systems have no moving components to create the fluid flow.

17 Claims, 4 Drawing Sheets

(56) References Cited

U.S. PATENT DOCUMENTS

| | | | | |
|---|---|---|---|---|
| 7,679,910 B2 * | 3/2010 | Chen | ................... | H01L 23/473 |
| | | | | 165/80.4 |
| 7,830,643 B2 * | 11/2010 | DuBose | ............ | H05K 7/20172 |
| | | | | 361/225 |
| 7,913,747 B2 * | 3/2011 | Chen | ...................... | F28D 15/00 |
| | | | | 165/104.23 |
| 9,843,250 B2 * | 12/2017 | Tsoi | ...................... | H02K 44/02 |
| 2005/0112816 A1 * | 5/2005 | Myers | ................... | H01L 23/473 |
| | | | | 257/E23.098 |
| 2005/0230080 A1 | 10/2005 | Paul et al. | | |
| 2006/0044759 A1 | 3/2006 | Chebiam et al. | | |
| 2007/0171593 A1 | 7/2007 | DuBose | | |
| 2008/0302510 A1 | 12/2008 | Ouyang | | |
| 2009/0065177 A1 | 3/2009 | Ouyang | | |
| 2009/0168344 A1 | 7/2009 | Ploeg et al. | | |
| 2010/0307724 A1 | 12/2010 | Ichii et al. | | |
| 2011/0253348 A1 * | 10/2011 | Huang | ............... | H05K 7/20172 |
| | | | | 165/104.34 |
| 2015/0271951 A1 * | 9/2015 | Chiu | ...................... | H01T 23/00 |
| | | | | 361/231 |
| 2022/0003227 A1 * | 1/2022 | Vijayaraghavan | ........................... | |
| | | | | H05K 7/20209 |
| 2022/0210945 A1 * | 6/2022 | Vadillo | ................... | H01T 19/04 |
| 2023/0024941 A1 * | 1/2023 | Mulay | ..................... | H01T 19/04 |

OTHER PUBLICATIONS

Foley, A., "New Approach to Electronics Cooling Using a Corona Discharge", COMSOL Blog, 1-4 (Aug. 16, 2013).

* cited by examiner

CORONA DISCHARGE POWERED COOLING

CROSS-REFERENCE TO RELATED APPLICATION

This application claims the benefit of Indian Provisional Patent Application No. 202111033117, filed on Jun. 23, 2021, the disclosure of which is incorporated herein by reference in its entirety.

BACKGROUND

In the Aerospace industry, increasing voltage requirements on electronic equipment are made alongside the ever constant demands for smaller and lighter components. Motors, converters, inverters, avionics, data storage, and other such equipment are all becoming more energy dense. Overheating is a common cause of failure for such electronic equipment. Accordingly, ventilation systems must be provided to cool the electronic equipment. However, the ventilation systems add cost and weight to the designs. Further, moving components of the ventilation systems, such as fans, also add design complexity and additional points of possible failure.

Improvements are desired.

SUMMARY

Some aspects of the disclosure are directed cooling of electronic equipment—and especially high voltage electronic equipment—using an ionic motion generator. The ionic motion generator includes an anode and a cathode that generate a discharge and flow of ions in a common direction. The anode and cathode are positioned along a fluid pathway so that the ionic discharge generates movement of the fluid along the pathway. This pathway can be routed to or across various types of electronic equipment to be cooled.

In certain aspects, the pathway can be routed across heatsinks and/or heat exchangers to disperse the heat. In some implementations, the pathway forms a closed loop leading back to the ionic motion generator. In other implementations, the pathway extends from a first end at the motion generator to a second end at the heat exchanger or vent. In other implementations, the pathway extends from the motion generator to the electronic equipment or heatsink.

In certain implementations, the electronic equipment to be cooled includes a power converter, a power inverter, a motor, avionics equipment, or data storage.

In certain implementations, the fluid pathway contains air and the flow of ions generates ionic wind. In certain examples, the air includes contaminants to enhance the fluid flow.

In some implementations, the pathway leads to nozzles directed towards the electronic equipment. In other implementations, a heat sink extends into the pathway extending past the electronic equipment.

A variety of additional inventive aspects will be set forth in the description that follows. The inventive aspects can relate to individual features and to combinations of features. It is to be understood that both the forgoing general description and the following detailed description are exemplary and explanatory only and are not restrictive of the broad inventive concepts upon which the embodiments disclosed herein are based.

BRIEF DESCRIPTION OF THE DRAWINGS

The accompanying drawings, which are incorporated in and constitute a part of the description, illustrate several aspects of the present disclosure. A brief description of the drawings is as follows.

DETAILED DESCRIPTION

Reference will now be made in detail to exemplary aspects of the present disclosure that are illustrated in the accompanying drawings. Wherever possible, the same reference numbers will be used throughout the drawings to refer to the same or like parts.

The present disclosure is directed to a thermal management system for use with electronic equipment. In certain implementations, the thermal management system is used with electronic equipment on an aerospace vehicle. The thermal management system includes a fluid pathway extending between a heat exchanger and the electronic equipment to be cooled; and an ionic motion generator disposed along the fluid pathway so that the corona discharge generates fluid movement along the fluid pathway.

High altitude aerospace environments result in lower air density, which increases the likelihood of experiencing corona discharge. Typically, steps are taken to avoid corona discharge as the discharge of ions can be detrimental or damaging to the equipment. However, the thermal management system disclosed herein harnesses this energy to power the cooling of the electronic equipment.

Figure 1:
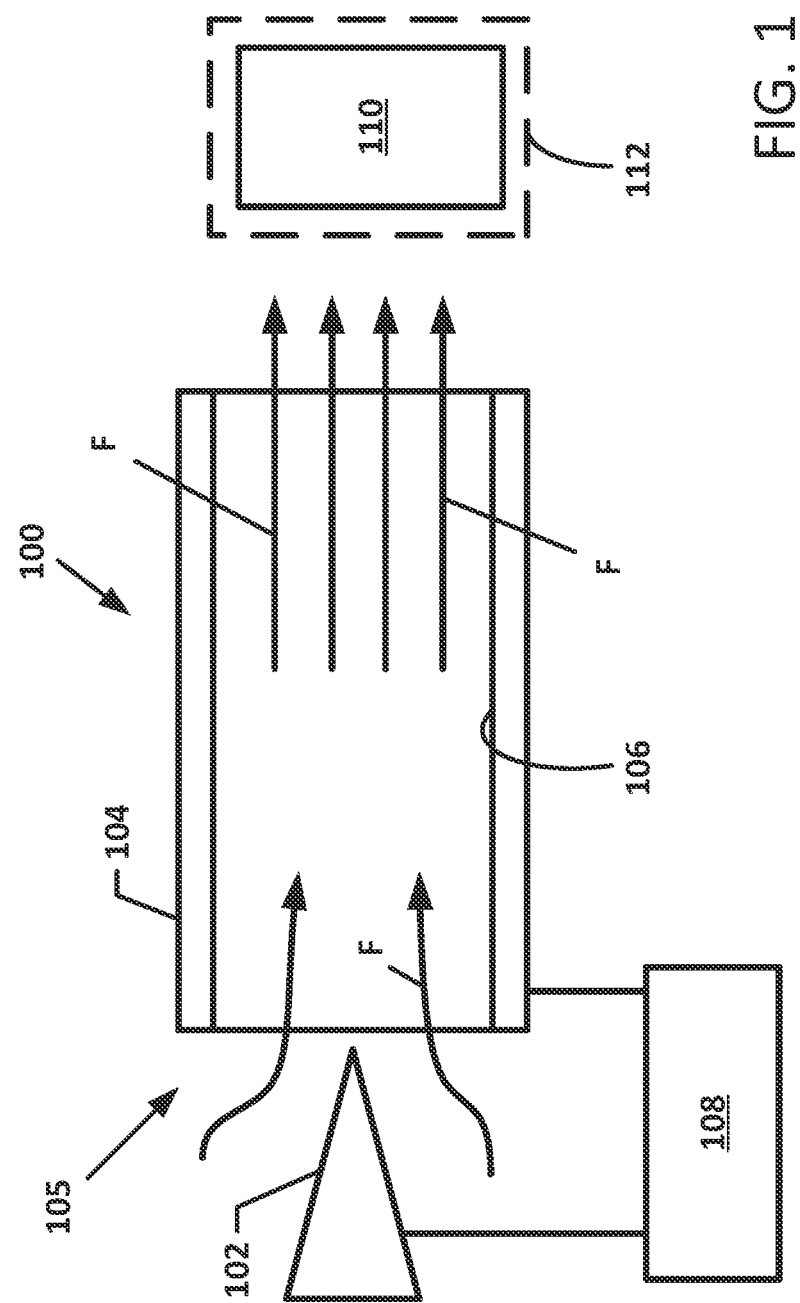
FIG. 1 is a schematic diagram showing an ionic motion generator directing fluid flow towards an electronic component.

Referring to FIG. 1, a thermal management system 100 includes an ionic motion generator 105 disposed at one end of a path leading to electronic equipment 110. The ionic motion generator 105 includes an anode 102 and a cathode 104 that are electrically coupled to a power source 108 that generates a voltage drop between them. In certain implementations, the generator 105 may include multiple pairs of anodes 102 and cathodes 104. In certain implementations, the voltage drop is a high voltage drop. In certain implementations, the voltage drop is in the magnitude of 8,000 volts to 50,000 volts. In certain examples, the voltage drop is between 10,000 volts and 40,000 volts. In certain examples, the voltage drop is between 10,000 volts and 30,000 volts. In certain examples, the voltage drop is between 15,000 volts and 35,000 volts. In certain examples, the voltage drop is between 20,000 volts and 40,000 volts. Other voltage drops are possible.

The anode 102 and cathode 104 of each pair are positioned sufficiently close together to generate ionic discharge therebetween. In certain examples, the voltage applied to the anode 102 is sufficiently high and the density of the surrounding fluid (e.g., air) is sufficiently low to generate corona discharge. The cathode 104 directs the discharged ions in a common direction, which results in a drag effect on the surrounding air or other fluid, which creates fluid flow from the anode to the cathode. The cathode 104 or surrounding environment can be configured to harness this fluid flow to direct fluid past either the electronic equipment to be cooled 110 or one or more heat sinks 112 mounted thereat.

In certain implementations, the cathode 104 defines a through opening 106 with which the anode 102 aligns. The through opening 106 defines a path along which the ions flow when discharged from the anode 102. In certain examples, the cathode is elongated along the direction of the through opening 106. The movement of the ions generates a flow of fluid (e.g., air or other gas,) through the opening 106. In certain examples, the opening 106 has a cross-dimension (e.g., diameter) between 5 mm and 50 mm. In certain examples, the opening 106 has a cross-dimension between 5 mm and 25 mm. In certain examples, the cross-dimension is between 25 mm and 50 mm. In certain examples, the cross-dimension is between 15 mm and 40 mm.

In some implementations, the cathode 104 includes a circular or oblong shaped tube. In other implementations, the cathode 104 can have a square transverse cross-sectional shape, a triangular transverse cross-sectional shape, or any other desired transverse cross-sectional shape. In certain examples, the cathode 104 may be shaped to channelize the fluid flowing therethrough to provide a more consistent fluid flow downstream at the electronic equipment or heat sink.

In some implementations, the anode 102 is formed by printing or otherwise fixing an electrode onto a dielectric material (e.g., a dielectric plate). In other implementations, the anode 102 can be formed by leaving a small uncoated section of an electrically conductive material that is otherwise coated with a dielectric material. The anode 102 is positioned to align with the through opening 106 of the cathode 104.

In some implementations, the cathode 104 is formed by printing or otherwise fixing an electrode onto a dielectric material (e.g., the dielectric plate) so that the cathode 104 is electrically isolated from the anode 102. The cathode 104 is configured so that an exit of the through opening 106 faces the electronic equipment to be cooled 110 or a heatsink 112 attached thereto. In other implementations, the cathode 104 defines a heatsink (i.e., is formed of a material that transmits heat). In such implementations, the cathode 104 may be attached directly to the electronic equipment 110 (e.g., see FIG. 2).

Figure 2:
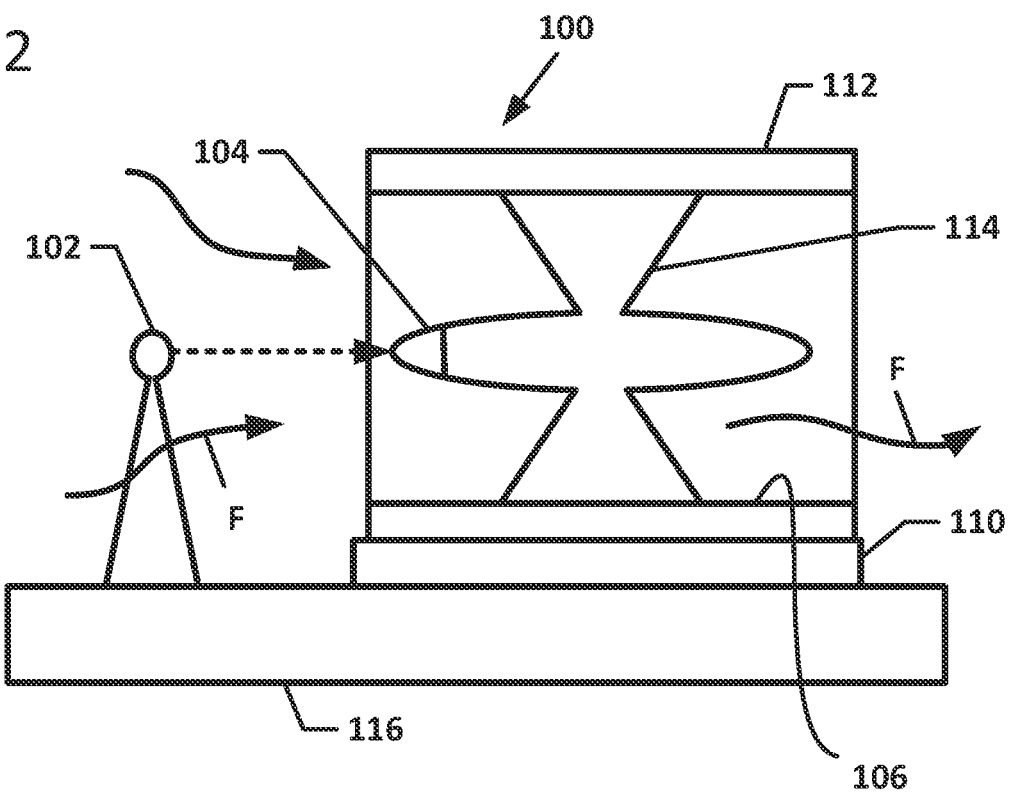
FIG. 2 shows the ionic motion generator being implemented with a heatsink to cool and electronic component.
Figure 3:
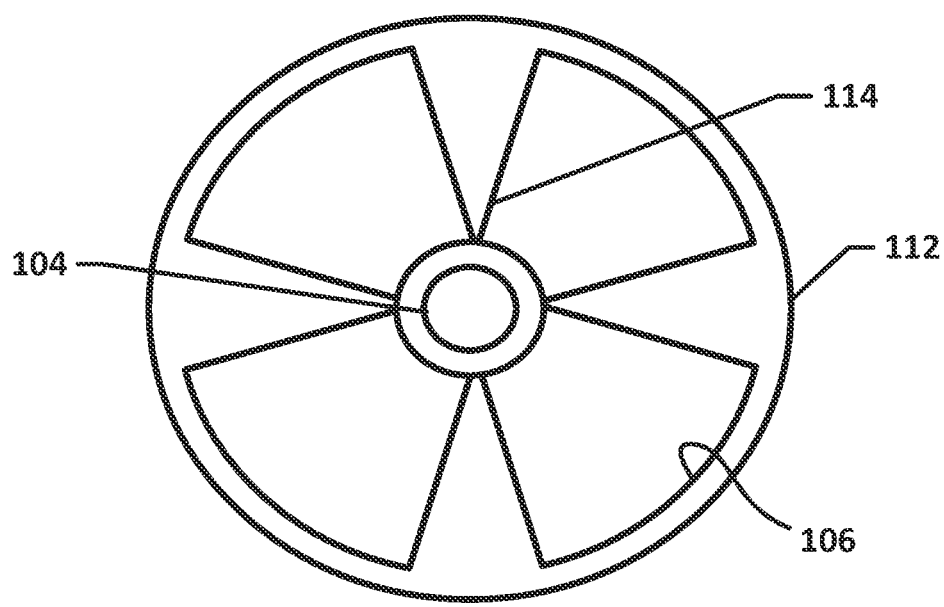
FIG. 3 is a front elevational view of the heatsink of FIG. 2.

In the example depicted in FIGS. 2 and 3, the anode 102 and electronic equipment 110 are mounted to a substrate 116, such as a circuit board. A heat sink 112 is mounted over the electronic equipment 110. The cathode 104 is formed on the heat sink 112 in alignment with the anode 102. In certain examples, the cathode 104 is formed from an electrode printed into a surface of the heat sink 112.

The heat sink 112 defines the path 106 through which the fluid will flow. In the depicted example, the heat sink 112 includes a plurality of fins 114 disposed along the path 106 to form a ducted fan shape. The fins 114 are stationary. These fins 114 aid in directing the flowing fluid (e.g., air) along the path 106 and providing surface area from which the heat of the electronic equipment may be dispersed into the flowing fluid. The flowing fluid carries the heat from the heat sink 112 (e.g., from the fins 114) away from the heat sink 112.

Figure 4:
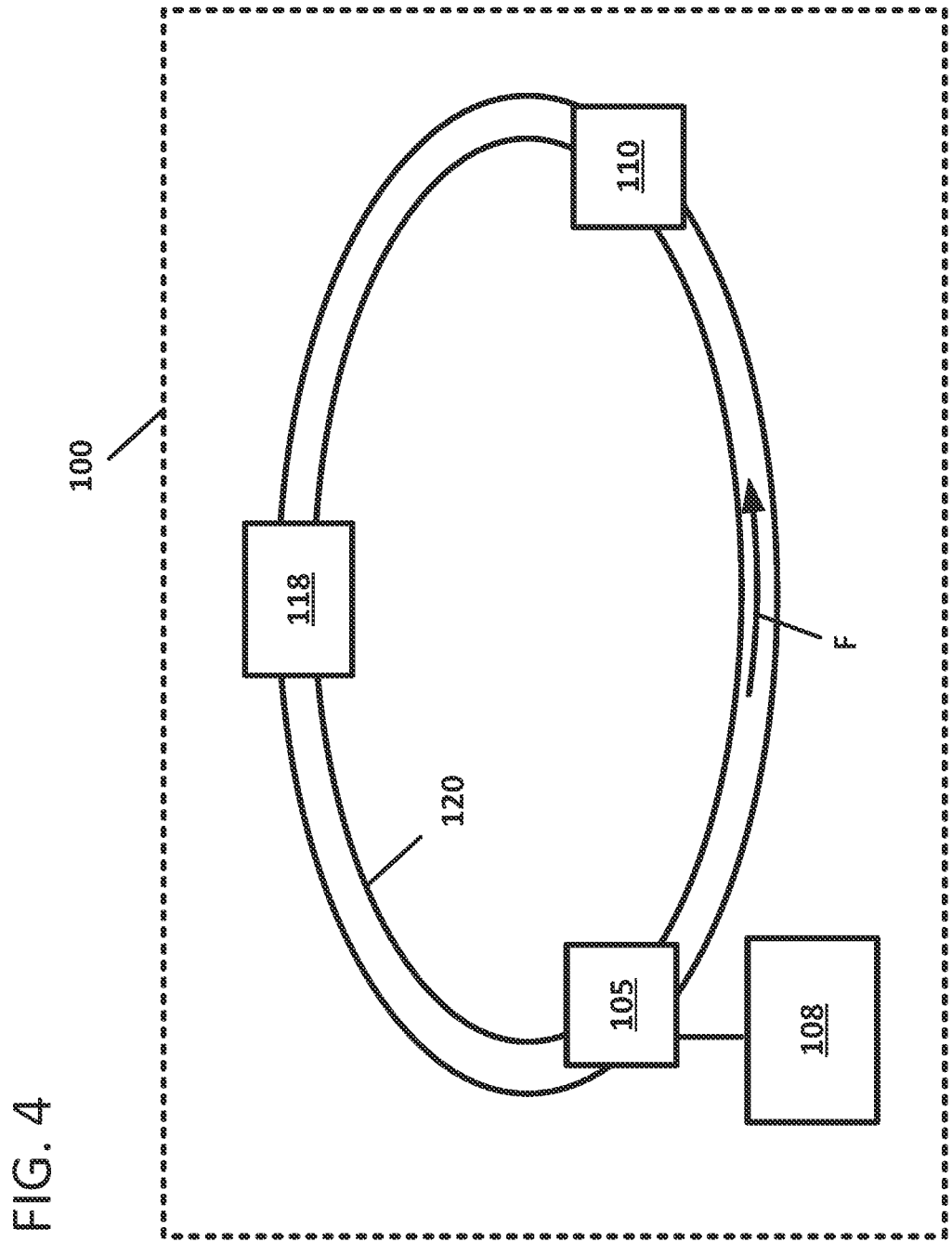
FIG. 4 is a schematic diagram of a closed loop conduit arrangement connecting an ionic motion generator, equipment to be cooled, and a heat exchanger.

Referring to FIG. 4, the thermal management system 100 may be implemented within a closed loop environment. In some implementations, the thermal management system 100 and the electronics 110 combine to form a self-contained system. In other implementations, the thermal management system 100 is a separate system that can be added to an environment to cool the electronics 110. The ionic motion generator 105 is fluidly coupled to a conduit 120 or other closed channel. A heat exchanger 118 also is fluidly coupled to the conduit 120 to remove heat carried by the fluid (e.g., gas or liquid) within the conduit 120. Fluid flows along the conduit 120 in a loop amongst these components.

In some implementations, the conduit 120 is formed from tubing or piping extending between the ionic motion generator 105, the electronic equipment 110, and the heat exchanger 118. In other implementations, the conduit 120 is formed from a cavity etched, carved, or otherwise defined within a solid structure (e.g., a substrate of a circuit board). In other examples, the cavity may be formed by additive manufacturing of the solid structure. In some examples, the electronic equipment to be cooled 110 is disposed within the conduit 120. In other examples, the electronic equipment to be cooled is positioned adjacent the conduit 120.

Figure 5:
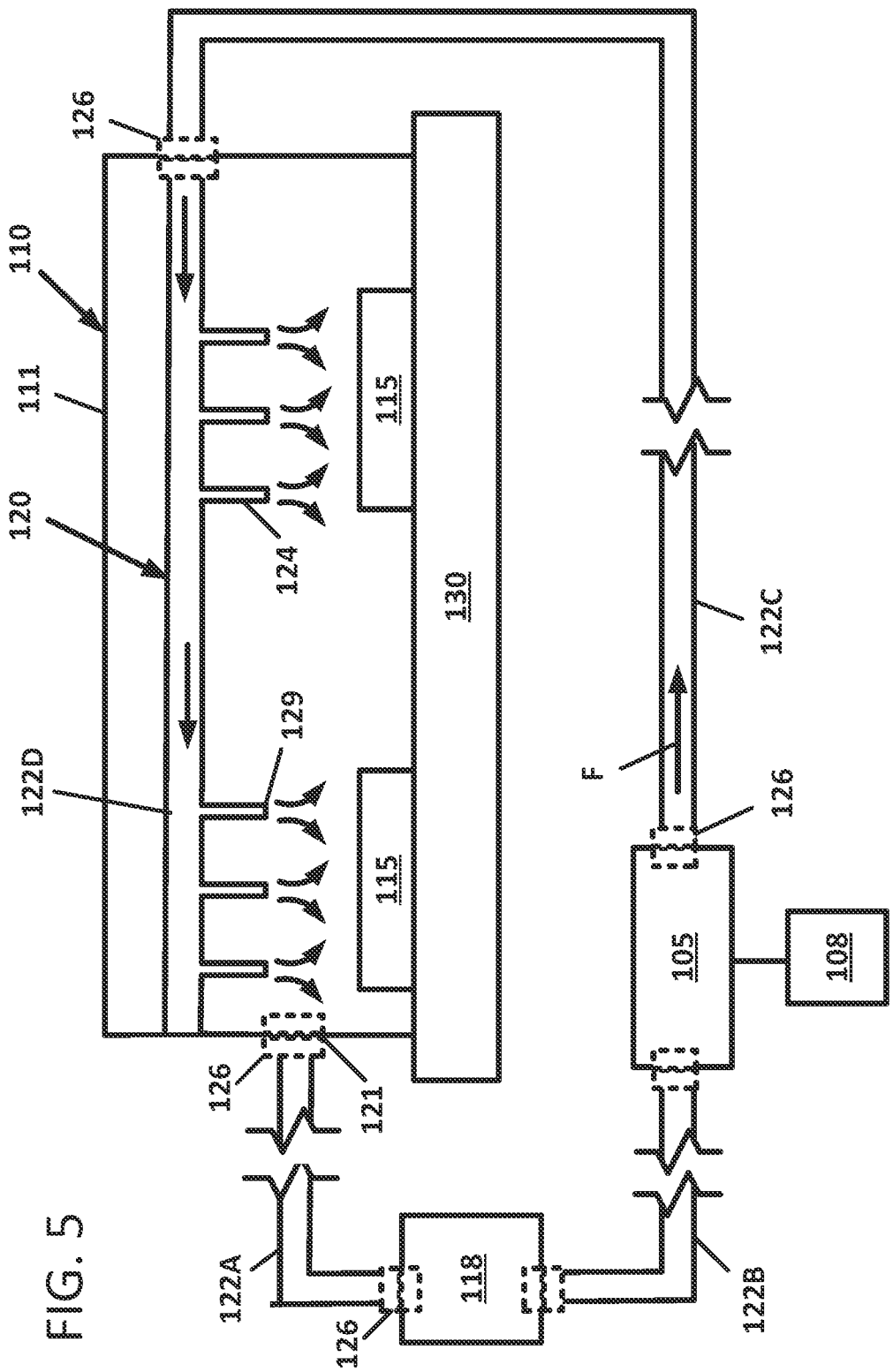
FIG. 5 shows a conduit arrangement forming an interrupted path including nozzles to blow fluid over equipment to be cooled.

In certain implementations, the conduit 120 is an arrangement formed from multiple conduit sections that extend between and couple together the other components of the thermal management system 100. For example, as shown in FIG. 5, a conduit arrangement 120 includes multiple lengths of conduit (e.g., tubing or piping) 122A, 122B, 122C that connect the ionic motion generator 105, the electronic equipment 110, and the heat exchanger 118. The conduit arrangement 120 also may include conduit sections or pathways extending through the components such as pathway 122D extending through the electronic equipment 110. Similar pathways may extend through the ionic motion generator 105 and/or the heat exchanger 118, but are not shown to simplify the drawing. The conduit sections 122A-122D may be coupled together at connection interfaces 126. Various types of connection interfaces 126 can be used such as push-to-connect tube fittings, threaded tube fittings, barbed tube fittings, compression tube fittings, quick disconnect couplings, socket connect fittings, flared fittings, or clamps.

In some implementations, the conduit arrangement 120 form a continuous closed loop between the ionic motion generator 105, the equipment 110, and the heat exchanger 118. For example, a heatsink or heated component of the equipment to be cooled may extend into the conduit arrangement 120 itself. In certain implementations, the conduit arrangement 120 may be define an internal path within an electrical component such as a solid state circuit breaker or cold plate.

In other implementations, the conduit arrangement 120 is an interrupted closed loop having an entrance 121 and an exit 129. For example, in FIG. 5, the conduit arrangement 120 includes a pathway 122D extending through an outer housing 111 of the electronic equipment 110. The pathway 122D includes one or more nozzles 124 that branch from the pathway 122D to direct a portion of the fluid flowing through the conduit arrangement 120 towards one or more components 115 within the outer housing 111. The nozzles 124 form the exits 129 of the conduit arrangement 120. An intake 121 on the housing 111 forms the entrance 121 of the conduit arrangement 120, leading to a conduit section 122A extending towards the heat exchanger 118. Accordingly, the fluid flowing over the heat generating components 115 carries heat from the components, through the intake 121, and towards the heat exchanger 118.

In other implementations, the fluid from the nozzles 124 is directed towards heat sinks coupled to the heat generating components 115. In other implementations, the conduit arrangement 120 does not form a closed loop. Rather, the ionic motion generator 105 may define an intake at which new fluid may be introduced while the heat exchanger 118 vents to ambient atmosphere (e.g., if the fluid is a gas) or to a reserve tank (e.g., if the fluid is a liquid). In certain implementations, the ionic motion generator 105 is disposed in or at the heat exchanger 118 to create a suction flow through the conduit arrangement 120 instead of a propellant flow. In still other implementations, the ionic motion generator 105 and/or the heat exchanger 118 may be incorporated within the body 111 of the electronic equipment 110.

In the example shown in FIG. 5, the electronic equipment includes an inverter having a housing 111 disposed on a circuit board 130. In certain examples, the components 115 to be cooled include Insulated Gate Bipolar Transistors (IGBTs) mounted to the circuit board 130. Other types of components within the inverter also may benefit from cooling. One or more nozzles 124 may be aligned with the components 115 to blow air or other gases over the components 115. The heated gases may be directed to the conduit intake 121 via pressure within the housing 111, suction from the conduit arrangement 120, or some combination thereof.

In accordance with some aspects of the disclosure, the voltage drop between the anode 102 and the cathode 104 is generated by a power supply 108. In accordance with other aspects of the disclosure, the voltage drop is at least partly powered from noise emissions generated by the electronic equipment. For example, conversion circuitry tends to produce normally undesirable side effects such as overvoltage oscillations and EMI emissions. In certain implementations, the emitted energy can be extracted from the conversion circuitry and redirected to circuitry applying a high voltage to the anode 102. Other types of circuitry also may emit energy noise that can be harnessed to power the voltage drop.

Certain types of EMI missions may be constantly generated and can provide the power for the voltage drop. Other types of EMI missions will cycle based on the usage of the circuitry generating the emissions. In certain examples, the energy harvested from the EMI emissions may be used to supplement the power supply. Further, because the cycles may correspond with the usage of the circuitry, the cycles also are likely to correspond with the heat generation of the circuitry so supplemental power would be supplied when needed.

ASPECTS

1. A thermal management system for use with electronic equipment, the thermal management system comprising:
   a fluid pathway extending between a heat exchanger and electronic equipment to be cooled; and
   an ionic motion generator including an anode spaced from a cathode, the anode and the cathode having a voltage drop sufficient to generate a ionic discharge between the anode and the cathode, the ionic motion generator disposed along the fluid pathway so that the ionic discharge generates fluid movement along the fluid pathway.
2. The thermal management system of aspect 1, wherein the fluid pathway contains air and the fluid movement includes ionic wind.
3. The thermal management system of aspect 2, wherein the air includes contaminants to enhance the fluid flow.
4. The thermal management system of any of aspects 1-3, wherein the fluid pathway forms a closed loop.
5. The thermal management system of any of aspects 1-4, wherein the fluid pathway passes over or through the electronic equipment to be cooled so that the fluid movement draws heat from the electronic equipment along the fluid pathway.
6. The thermal management system of any of aspects 1-4, wherein the fluid pathway includes nozzles at which fluid exits the fluid pathway in a direction towards the electronic equipment to be cooled.
7. The thermal management system of any of aspects 1-6, further comprising a power source to apply the voltage drop between the anode and the cathode.
8. The thermal management system of aspect 7, wherein power from the power source is supplemented by harvesting EMI emissions from the electronic equipment to be cooled.
9. The thermal management system of any of aspects 1-6, wherein power generating the voltage drop is harvested from overvoltage oscillations and/or EMI emissions at the electronic equipment to be cooled.
10. The thermal management system of any of aspects 1-9, wherein the electronic equipment to be cooled includes a power converter, a power inverter, a motor, or avionics.
11. The thermal management system of any of aspects 1-10, wherein the electronic equipment, the ionic motion generator, and the fluid pathway are contained within a housing.
12. The thermal management system of any of aspects 1-10, wherein the fluid pathway includes a plurality of pathway segments having connection interfaces at which the pathway segments connect to each other.
13. The thermal management system of any of aspects 1-12, wherein the cathode includes a duct.
14. The thermal management system of aspect 13, wherein the duct is hollow.
15. The thermal management system of aspect 13, wherein the duct contains fins to spread fluid movement across the duct.
16. The thermal management system of aspects 1-15, wherein the fluid pathway is an enclosed pathway.
17. The thermal management system of any of aspects 1-16, wherein the cathode includes a heat sink.
18. The thermal management system of any of aspects 1-16, further comprising a heat sink disposed along the fluid pathway downstream of the cathode.
19. A heat sink comprising:
   a dielectric base;
   an anode supported by the dielectric base;
   a cathode supported by the dielectric base; and
   heat dispersal fins extending outwardly from the dielectric base.
20. A method of cooling electronic equipment comprising:
   providing a voltage drop between an anode and a cathode to generate ionic discharge along a pre-determined direction; and directing fluid flow generated by the ionic discharge towards a heated component.
21. The method of aspect 20, wherein the heated component includes a heatsink mounted at the electronic equipment.
22. The method of aspect 20, wherein the heated component includes the electronic equipment.
23. The method of any of aspects 20-22, further comprising directing the fluid flow from the heated component to a heat exchanger.
24. The method of any of aspects 20-23, wherein providing a voltage drop includes connecting the anode and the cathode to a power supply.

25. The method of any of aspects 20-23, wherein providing a voltage drop includes harvesting EMI voltage in place of, or supplementing a power supply.

Having described the preferred aspects and implementations of the present disclosure, modifications and equivalents of the disclosed concepts may readily occur to one skilled in the art. However, it is intended that such modifications and equivalents be included within the scope of the claims which are appended hereto.

What is claimed is:

1. A thermal management system for use with electronic equipment, the thermal management system comprising:
   a fluid pathway extending between a heat exchanger and electronic equipment to be cooled; and
   an ionic motion generator including an anode spaced from a cathode, the anode and the cathode having a voltage drop sufficient to generate an ionic discharge including a flow of ions between the anode and the cathode, the ionic motion generator being disposed along the fluid pathway so that the ionic discharge generates fluid movement along the fluid pathway,
wherein the fluid pathway forms a closed loop,
wherein the electronic equipment, the ionic motion generator, the heat exchanger and the fluid pathway are contained within a housing,
wherein the cathode defines a through opening with which the anode aligns, and
wherein the through opening defines a path along which the ions flow when discharged from the anode.

2. The thermal management system of claim 1, wherein the fluid pathway contains air and the fluid movement includes ionic wind.

3. The thermal management system of claim 1, wherein the fluid pathway passes over or through the electronic equipment to be cooled so that the fluid movement draws heat from the electronic equipment along the fluid pathway.

4. The thermal management system of claim 1, wherein the fluid pathway includes nozzles at which fluid exits the fluid pathway in a direction towards the electronic equipment to be cooled.

5. The thermal management system of claim 1, further comprising a power source to apply the voltage drop between the anode and the cathode.

6. The thermal management system of claim 5, wherein power from the power source is supplemented by harvesting EMI emissions from the electronic equipment to be cooled.

7. The thermal management system of claim 1, wherein the electronic equipment to be cooled includes a power converter, a power inverter, a motor, or avionics.

8. The thermal management system of claim 1, wherein the fluid pathway includes a plurality of pathway segments having connection interfaces at which the pathway segments connect to each other.

9. The thermal management system of claim 1, wherein the cathode includes a duct.

10. The thermal management system of claim 9, wherein the duct contains fins to spread fluid movement across the duct.

11. The thermal management system of claim 1, further comprising a heat sink disposed along the fluid pathway downstream of the cathode.

12. A method of cooling electronic equipment comprising:
   providing a voltage drop between an anode and a cathode to generate ionic discharge including a flow of ions along a pre-determined direction; and
   directing fluid flow generated by the ionic discharge along a fluid pathway towards a heated component, wherein the fluid pathway forms a closed loop,
the electronic equipment, the ionic motion generator, the heat exchanger and the fluid pathway are contained within a housing,
the cathode defines a through opening with which the anode aligns, and
the through opening defines a path along which the ions flow when discharged from the anode.

13. The method of claim 12, wherein the heated component includes a heatsink mounted at the electronic equipment.

14. The method of claim 12, wherein the heated component includes the electronic equipment.

15. The method of claim 12, further comprising directing the fluid flow from the heated component to a heat exchanger.

16. The method of claim 12, wherein providing a voltage drop includes connecting the anode and the cathode to a power supply.

17. The method of claim 12, wherein providing a voltage drop includes harvesting EMI voltage from the electronic equipment, in place of, or supplementing the power supply.

* * * * *